(12) United States Patent
Choi et al.

(10) Patent No.: US 7,439,593 B2
(45) Date of Patent: Oct. 21, 2008

(54) SEMICONDUCTOR DEVICE HAVING SILICIDE FORMED WITH BLOCKING INSULATION LAYER

(75) Inventors: Jeong-Min Choi, Incheon (KR); Tae-Hong Ha, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 482 days.

(21) Appl. No.: 10/750,983

(22) Filed: Jan. 2, 2004

(65) Prior Publication Data
US 2004/0217428 A1 Nov. 4, 2004

(30) Foreign Application Priority Data
Jan. 2, 2003 (KR) .................. 10-2003-0000072

(51) Int. Cl.
H01L 27/088 (2006.01)
H01L 29/78 (2006.01)
(52) U.S. Cl. .................. 257/384; 257/E29.04
(58) Field of Classification Search .......... 257/377, 257/373, 370, 367, 384, E29.04; 438/656, 438/682, 657, 683
See application file for complete search history.

(56) References Cited

U.S. PATENT DOCUMENTS 5,153,145 A * 10/1992 Lee et al. .................. 438/305
5,659,194 A * 8/1997 Iwamatsu et al. .......... 257/377
5,899,742 A * 5/1999 Sun .......................... 438/682
6,025,267 A * 2/2000 Pey et al. ................... 438/656
6,339,245 B1 * 1/2002 Maa et al. .................. 257/382
6,573,583 B2 * 6/2003 Hokazono ................. 257/486
2002/0109196 A1 * 8/2002 Fujisawa et al. ........... 257/384
2003/0230811 A1 * 12/2003 Kim ......................... 257/758

FOREIGN PATENT DOCUMENTS

JP 05-304108 11/1993

OTHER PUBLICATIONS

English language abstract of Japanese Publication No. 05-304108.

* cited by examiner

*Primary Examiner*—Evan Pert
(74) *Attorney, Agent, or Firm*—Marger Johnson & McCollom, P.C.

(57) ABSTRACT

Some embodiments include an isolation layer defining an active region of a substrate, a gate pattern formed on the active region, and source/drain regions formed in the active region. Sidewall spacers are formed on sidewalls of the gate pattern, and a blocking insulation layer is formed on the isolation layer and on a portion of the active region neighboring the isolation layer. A silicide layer is formed on source/drain regions between the blocking insulation layer and the sidewall spacers. Some embodiments include defining an active region of a substrate using an isolation layer, forming a gate pattern on the active region, implanting impurities into the active region, and forming a spacer insulation layer on a surface of the substrate with the gate pattern. A region of the spacer insulation layer becomes thinner the closer it is to the gate pattern. Other embodiments are described in the claims.

13 Claims, 9 Drawing Sheets

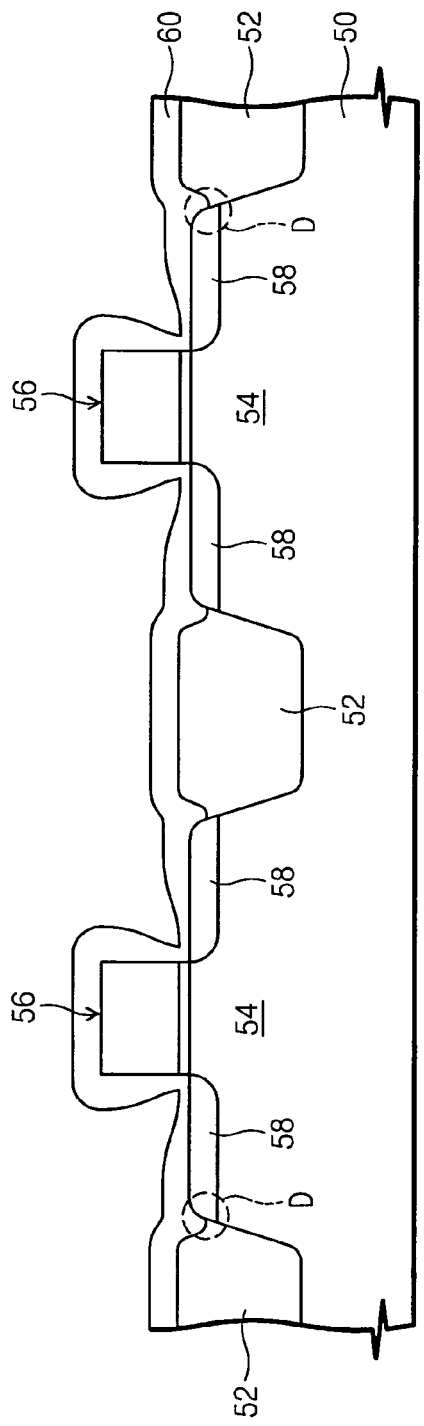
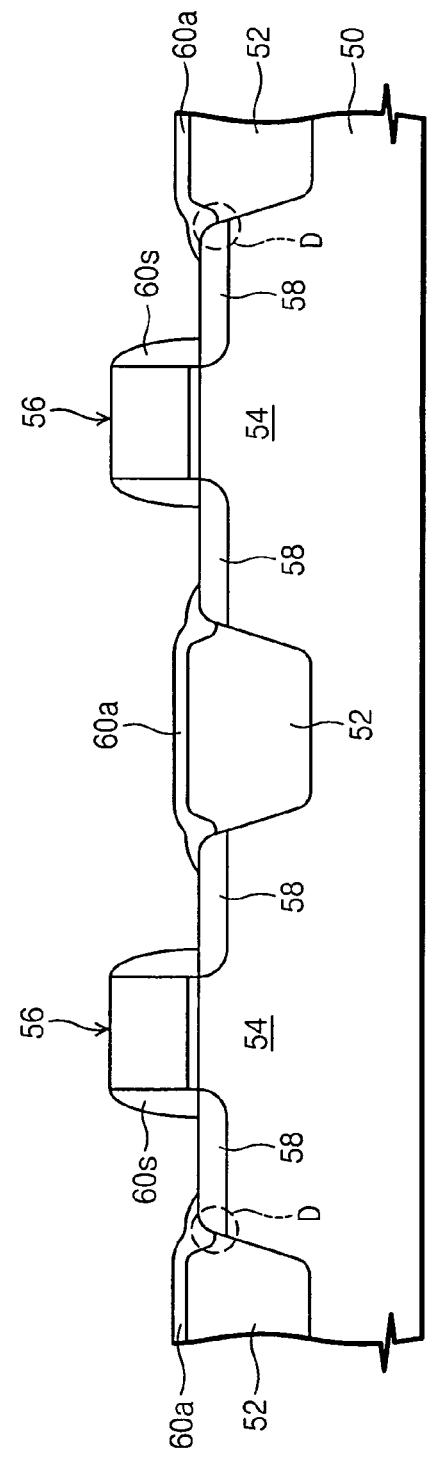

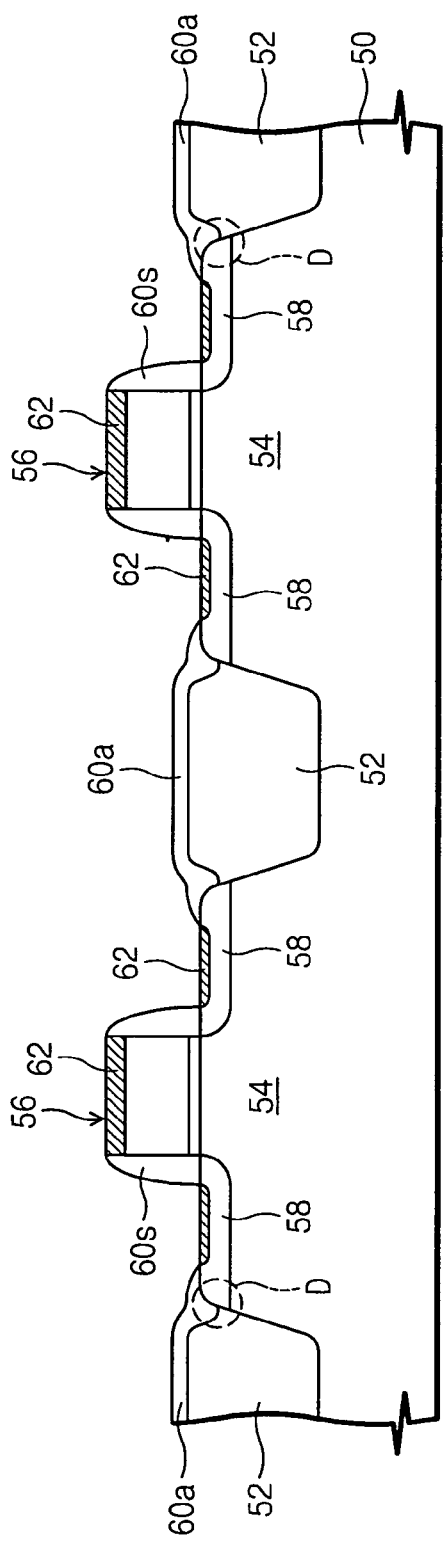
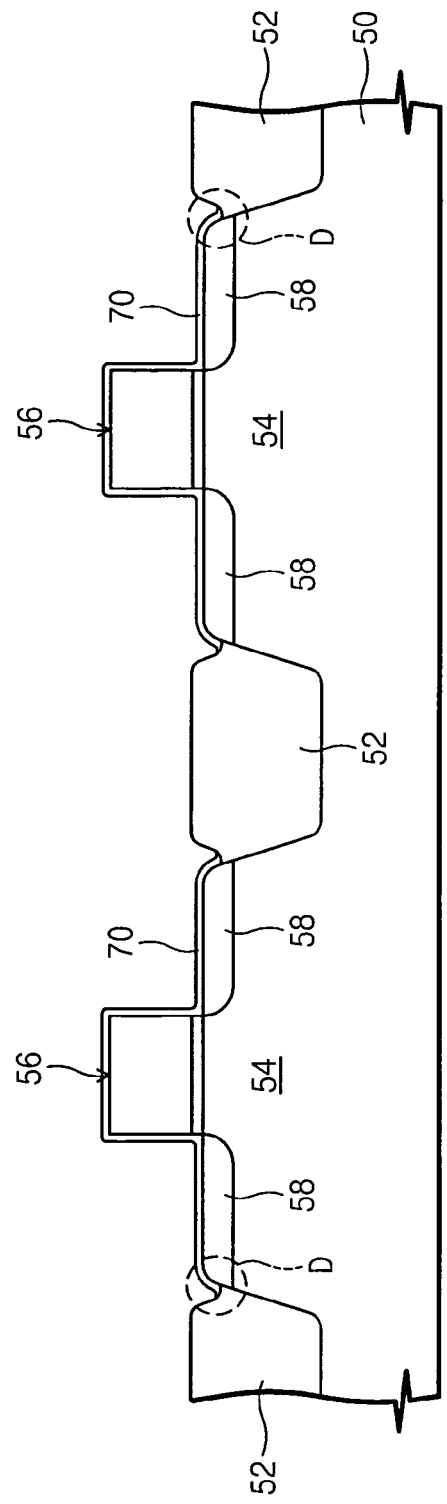

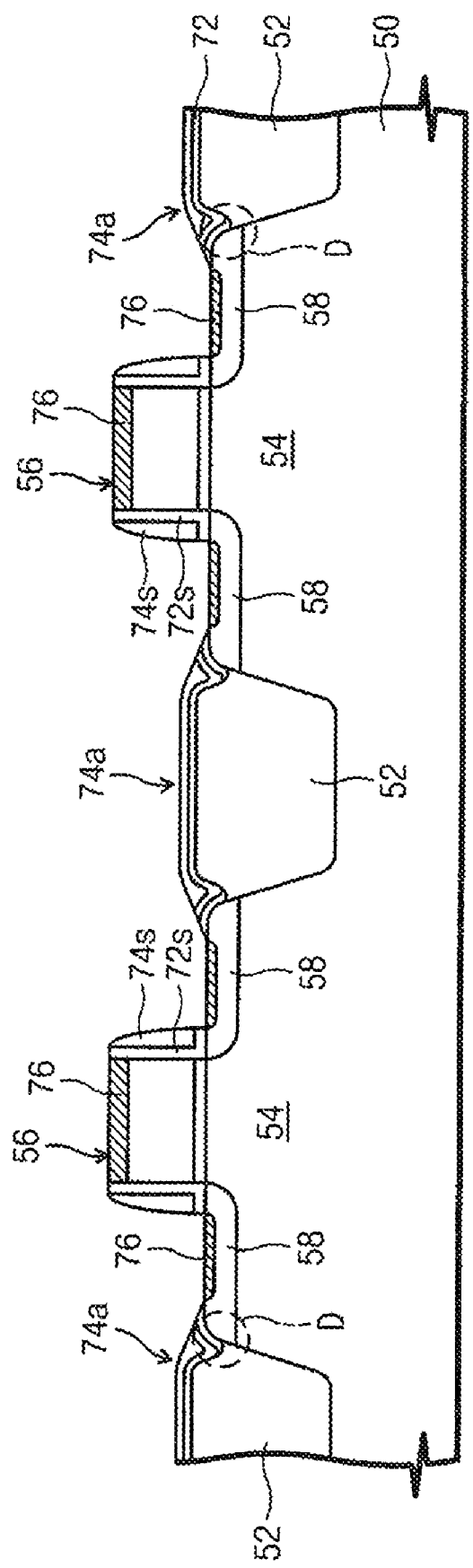

SEMICONDUCTOR DEVICE HAVING SILICIDE FORMED WITH BLOCKING INSULATION LAYER

CROSS REFERENCE TO RELATED APPLICATIONS

This application claims priority from Korean Patent Application No. 2003-00072, filed Jan. 2, 2003, the contents of which are hereby incorporated by reference in their entirety.

BACKGROUND OF THE INVENTION

1. Technical Field of the Invention

This disclosure generally relates to methods of fabricating semiconductor devices and more specifically to methods of fabricating silicide layers that are aligned to source/drain regions.

2. Description of the Related Art

A conventional method for fabricating a semiconductor device is to form a silicide layer on source/drain regions and on a polysilicon gate. The silicide layer provides various advantages such as a good ohmic contact, lowering the resistance of the polysilicon gate, and providing an etch stop layer to the source/drain region and the polysilicon gate.

A conventional process for forming a silicide layer is a self-aligned silicide process, also known as a salicide process. The salicide process includes a step of forming a metal layer, for instance, formed of cobalt, nickel or titanium combining silicon without reacting with a silicon oxide layer and a silicon nitride layer. The metals react with the silicon to form a low-resistance silicide such as $CoSi_2$, $NiSi$ or $TiSi_2$. The salicide process is applied to the semiconductor substrate with a gate electrode and source/drain region to form an aligned silicide layer on the source/drain regions and on the gate electrode with exposed silicon. The salicide process may form a thin and uniform silicide layer on the source/drain region and on the gate electrode.

In processes for fabricating semiconductor devices, a trench isolation layer is used for electrically isolating unit elements adjacent to each other. However, the trench isolation layer has a disadvantage that a dent is formed on a boundary with the active region.

FIGS. 1 and 2 are cross-sectional diagrams illustrating a conventional method for fabricating semiconductor devices.

Referring to FIG. 1, an isolation layer 12 is formed in a semiconductor substrate 10 to define an active region 14 by a trench isolation technique. As shown in FIG. 1, it is common for a dent to form in the isolation layer 12 neighboring the active region 14.

Referring to FIG. 2, a gate pattern 16 is formed on the active region 14, and source/drain regions 18 are formed in the active region neighboring the gate pattern 16. Sidewall spacers 20 are formed on sidewalls of the gate pattern 16. Continuously, a conventional salicide process is applied to the resultant structure to form a silicide layer 22 on the source/drain regions 18 and the gate pattern 16. Because a dent D exists on a boundary between the active region 14 and the isolation layer 12, the silicide layer 22 is formed along a topology of the dent because the silicide layer provided by the salicide process is thin and uniform. Therefore, the silicide layer 22 forms a deep spike 26 to a bottom of the substrate in the dent D. As a result, leakage current occurs due to a focusing of electrical field through the spike 26, making the resulting shallow source/drain structure ineffective for preventing short channel effects such as punch through.

Embodiments of the invention address these and other disadvantages of the prior art.

SUMMARY OF THE INVENTION

Some embodiments of the invention are directed to a semiconductor device without a silicide layer on a dent of isolation layer and methods of fabricating the same.

Other embodiments of the invention provide a semiconductor device that prevents leakage currents due to a structure of the silicide layer and a method of fabricating the same.

Still other embodiments of the invention provide a semiconductor device with thin source/drain regions with a silicide layer and a method of fabricating the same.

In some embodiments, a semiconductor device is provided with a blocking insulating layer formed on the active region neighboring an isolation layer for preventing a formation of silicide layer.

BRIEF DESCRIPTION OF THE DRAWINGS

FIGS. 3 through 5 are cross-sectional diagrams illustrating a method for fabricating semiconductor devices according to some embodiments of the invention.

FIGS. 6 through 11 are cross-sectional diagrams illustrating a method for fabricating semiconductor devices according to other embodiments of the invention.

DETAILED DESCRIPTION OF THE INVENTION

Figure 1:
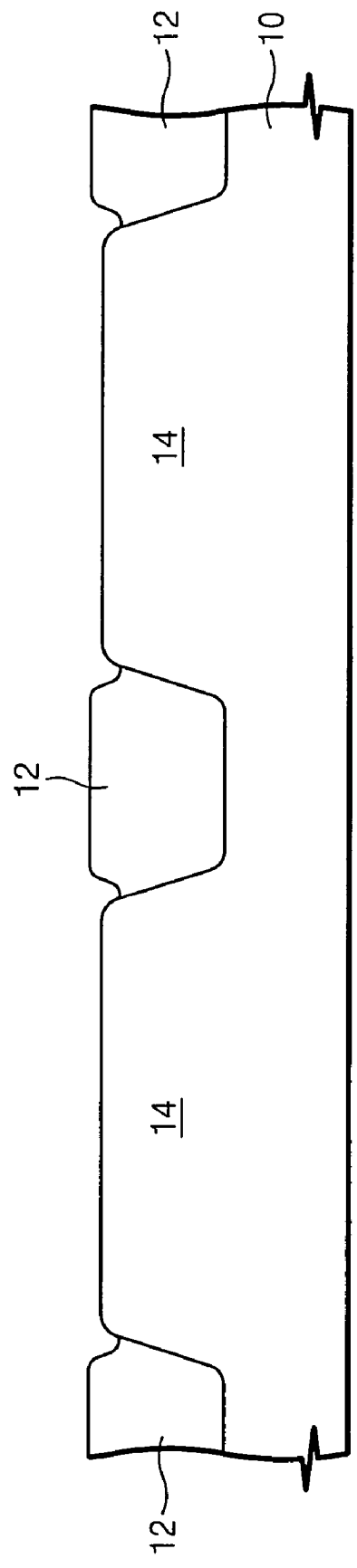
FIGS. 1 and 2 are cross-sectional diagrams illustrating a conventional method for fabricating semiconductor devices.
Figure 2:
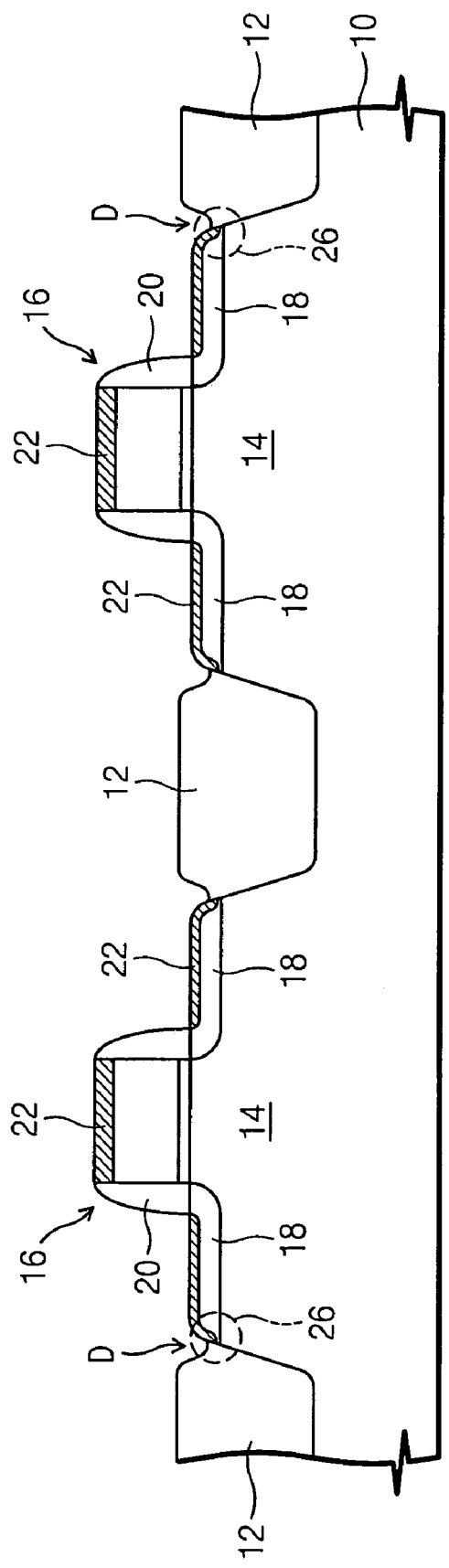

Embodiments of the invention will be described more fully hereinafter with reference to the accompanying drawings, in which preferred embodiments of the invention are shown. This invention, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 3 through 5 are cross-sectional diagrams illustrating a method for fabricating a semiconductor device according to some embodiments of the invention.

Referring to FIG. 3, an isolation layer 52 is formed in a semiconductor substrate 50 to define an active region 54. The isolation layer 52 may be formed by a conventional shallow trench isolation (STI) technique. When a trench isolation layer is formed by the STI technique, a dent D may be formed adjacent to the active region 54. Although various techniques for forming an isolation layer exist it is still likely that a dent will be formed due to a wet etching or a wet cleaning process following the isolation process.

A gate pattern 56 is formed on the active region 54. The gate pattern 56 crosses over the active region 54 and the isolation layer 52 (not shown). Source/drain regions 58 are formed in the active region 54 to both sides of the gate patterns 56. A spacer insulation layer 60 is formed on a semiconductor substrate 50 with the gate pattern 56. The spacer insulation layer 60 may be formed of silicon oxide or silicon nitride.

The spacer insulation layer 60 is formed relatively thin at the region neighboring the gate pattern 56 and becomes thicker as one moves from the gate pattern 56 to the isolation layer 52. In case of forming a material layer, the spacer insulation layer 60 is thickest around upper edges of the gate pattern 56 and thinnest around lower edges of the gate pattern 56 for improving deposition characteristics such as 3D effect or shadowing effect. In other words, the spacer insulation layer 60 is formed thinnest at the active region 54 neighboring the gate pattern 56.

The shadow effect increases under the condition of long mean free path of reaction gas and low surface migration. Therefore, the spacer insulation layer 60 may be formed effectively in a chamber having a low temperature and a low pressure. Preferably, the spacer insulation layer 60 may be formed of low temperature oxide (LTO) or low temperature nitride (LTN) that is formed by LPCVD.

Referring to FIG. 4, the spacer insulation layer 60 is etched using an anisotropic plasma etching method to form sidewall spacers 60s on sidewalls of the gate pattern 56. In this case, the thin spacer insulation layer 60 on the active region neighboring the gate pattern 56 is entirely removed, the thick spacer insulation layer 60 on the active region neighboring the isolation layer 52 is left to form a blocking insulation layer 60a for covering the dent D. The region neighboring the gate pattern 56 is etched rapidly, such that the spacer insulation layer 60 neighboring the gate pattern 56 may be removed without exposing the dent D. Generally, the etch rate can be raised at the region neighboring the pattern by increasing the bias power of the chamber.

Referring to FIG. 5, a silicide layer 62 is formed on the active region 54 exposed between the spacer insulation layer 60 and the blocking insulation layer 60a by applying a silicidation process to the semiconductor substrate 50. When the gate pattern 56 is formed of polysilicon single layer, a silicide layer 62 is also formed on a top surface of the gate pattern 56. A silicide layer 62 is not formed around the dent D, such that a leakage current due to the structure of silicide layer 62 can be prevented.

FIGS. 6 through 9 are cross-sectional diagrams illustrating a method for fabricating a semiconductor device according to other embodiments of the invention.

Referring to FIG. 6, an isolation layer 52 is formed on a semiconductor substrate 50 to define an active region 54. A gate pattern 56 is formed on the active region 54. The isolation layer 52 is formed by a shallow trench isolation technique. In this case, there may be a dent D formed in the isolation layer neighboring the active region 54. A buffer oxide layer 70 is formed by applying a thermal oxidation process to the semiconductor substrate 50 to form a buffer oxide layer 70.

Figure 7:
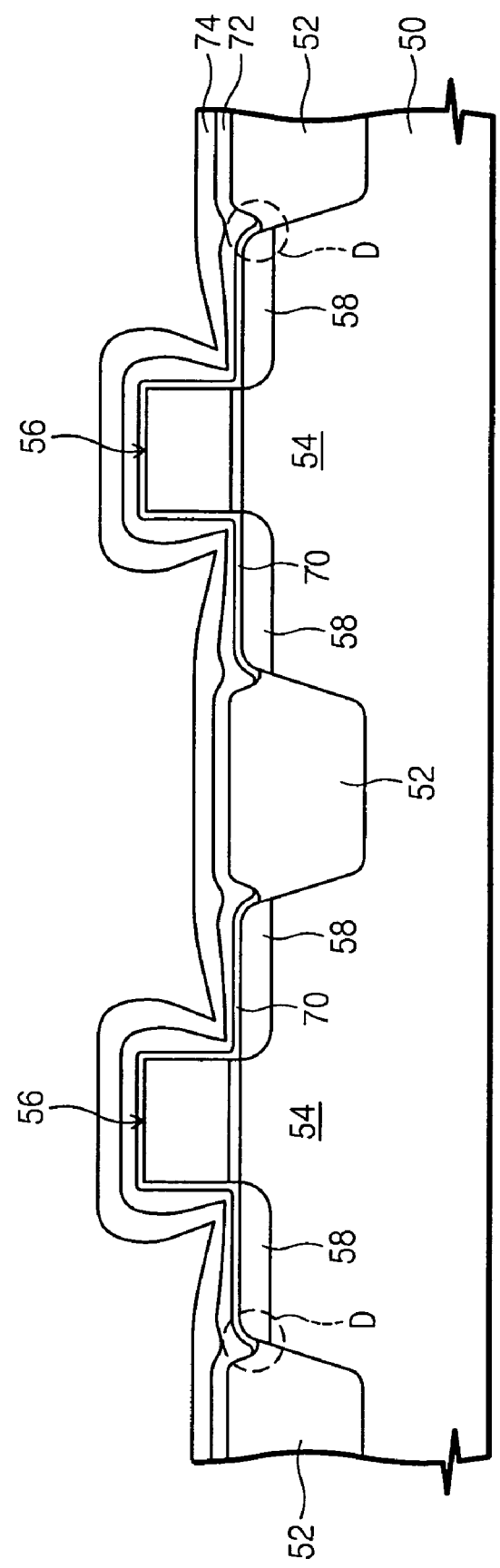

Referring to FIG. 7, a silicon nitride layer 72 and a silicon oxide layer 74 are sequentially formed on an entire surface of the semiconductor substrate 50 with the buffer oxide layer 70. At least one of the silicon nitride layer 72 and the silicon oxide layer 74 becomes thicker from the gate pattern 56 to the isolation layer 52. That is, at least one of the silicon nitride layer 72 and the silicon oxide layer 74 may be formed at an ambient of a chamber having low temperature and low pressure. For instance, the silicon nitride layer 72 or the silicon oxide layer 74 may be formed of LTO or LTN made by LPCVD method with low temperature.

Figure 8:
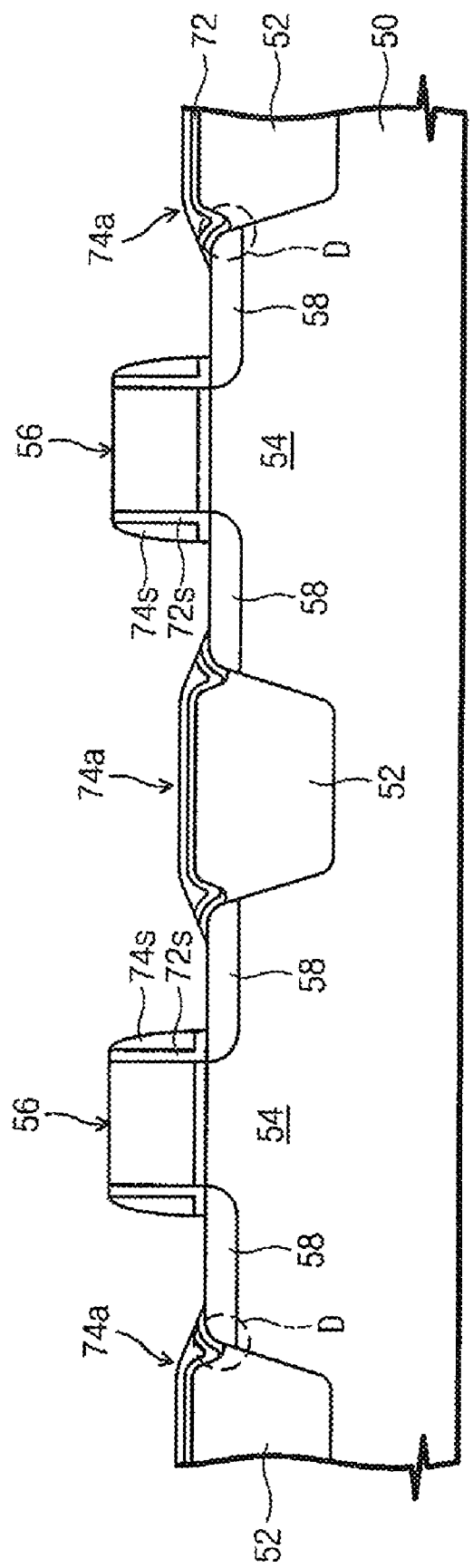

Referring to FIG. 8, the silicon oxide layer 74 is etched by an anisotropic plasma etching method to form outer spacers 74s having curved sidewalls. The silicon nitride layer 72 is etched using the outer spacers 74s as an etch mask to form inner spacers 72s having L-shaped cross-sections interposed between the outer spacers 74s and the gate pattern 56. In this case, the active region 54 neighboring the lower edges of the gate pattern 56 is exposed first since one of the silicon nitride layer 72 and the silicon oxide layer 74 grows thicker from the gate pattern 56.

Figure 9A:
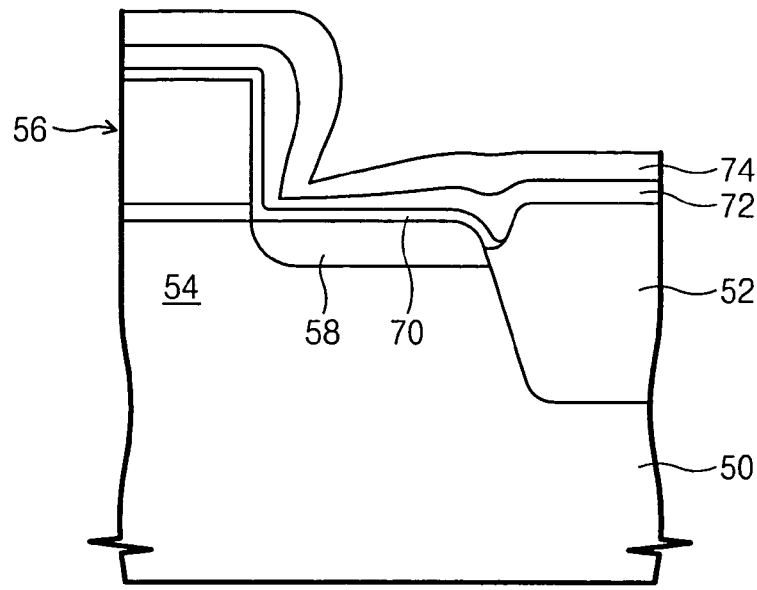
Figure 10A:
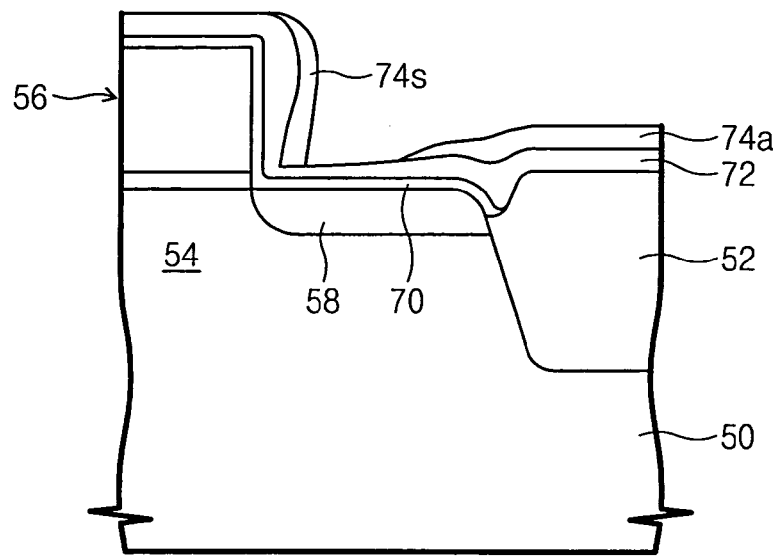

As illustrated in FIG. 9A, all the silicon nitride 72 and the silicon oxide layer 74 may be formed to grow thicker from the gate pattern 56 and the isolation layer 52. Referring to FIG. 10A, the silicon oxide layer 74 is isotropically etched to form outer spacers 74s having curved sidewalls. The silicon nitride layer 72 is etched using the outer spacers 74s as an etch mask to form inner spacers 72s having L-shaped cross-sections interposed between the outer spacer 74s and the gate pattern 56. In this case, at least one of the silicon oxide layer 74 or the silicon nitride layer 72 may be etched using a plasma etching method under the condition of high bias power.

Figure 9B:
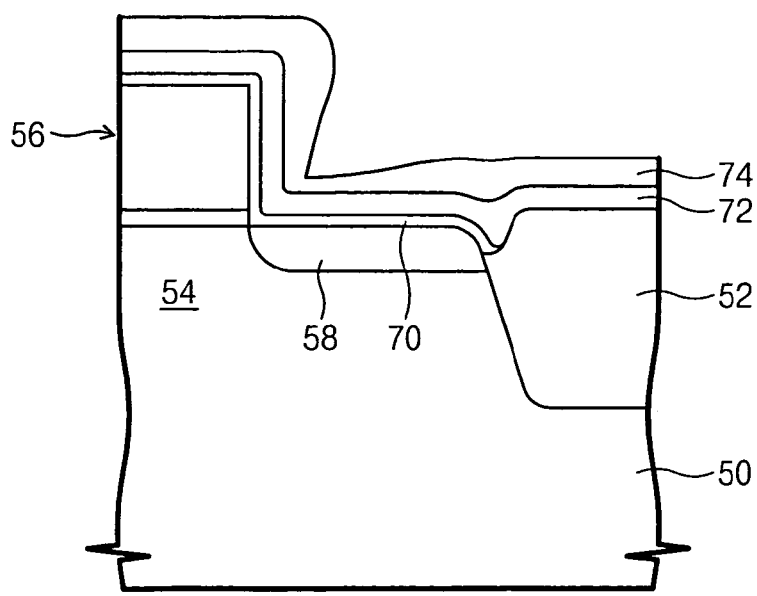

Alternatively, as illustrated in FIG. 9B, the silicon nitride layer 72 is formed conformally. The silicon oxide layer 74 may be formed to become thicker from the gate pattern 56 to the isolation layer 52.

Figure 10B:
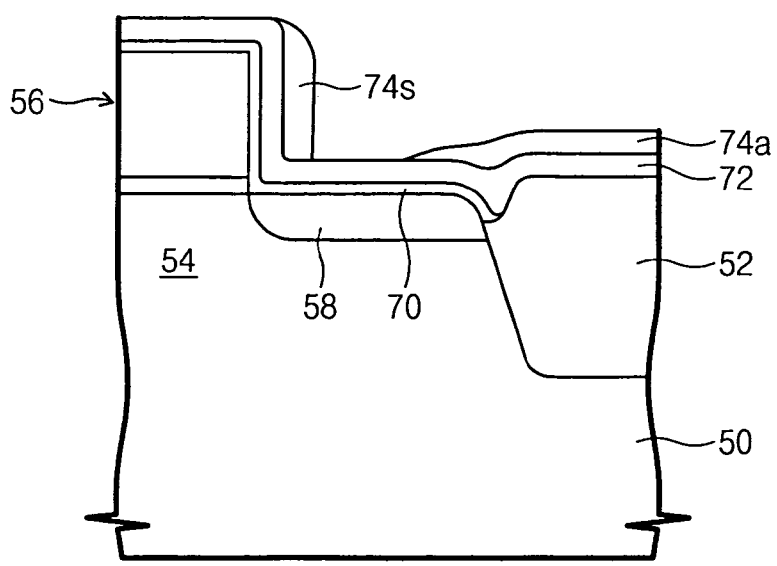

Referring to FIG. 10B, the silicon oxide layer 74 is anisotropically etched to form outer spacers 74s and to form a blocking oxide layer 74a. Furthermore, using the outer spacers 74s and the blocking oxide layer 74a as an etch mask, the silicon nitride layer 72 is anisotropically etched to form inner spacers having L-shaped cross-sections and a blocking nitride layer under the blocking oxide layer 74a. In this case, the silicon nitride layer 72 on the dent D is protected by the blocking oxide layer 74a, such that the silicon nitride layer 72 may be etched using a conventional anisotropic etching method.

Referring to FIG. 11, after removing the buffer oxide layer 70, a silicidation process is applied to the semiconductor substrate to form a silicide layer 76 on the active region 54 exposed between the blocking insulation layer 74a and the spacers 74s and 72s. The silicide layer 76 may be formed on a top surface of the gate pattern 56. The outer spacer 74s may be removed before the silicidation process, such that only L-shaped sidewall spacers 72s are formed on both sidewalls of the gate pattern 56.

According to embodiments of the invention, semiconductor devices with salicide source/drain regions except for around a dent of an isolation layer may be fabricated. Therefore, a leakage current flow due to a structure of the silicide layer may be prevented.

Embodiments of the invention will now be described in a non-limiting way.

Some embodiments of the invention include a field insulation layer formed in a substrate to define an active region, a gate pattern formed on the active region, and source/drain regions formed in active region at both sides of the gate pattern. Sidewall spacers are formed on sidewalls of the gate pattern, and a blocking insulation layer is formed on the isolation layer and on a portion of the active region neighboring the isolation layer. A silicide layer is formed on the source/drain regions between the blocking insulation layer and the sidewall spacers. The silicide layer has a boundary aligned to edges of the blocking insulation layer and the sidewall spacers. The sidewall spacer may include, for example, an L-shaped inner spacer and an outer spacer having a curved sidewall. The inner spacer is formed on the sidewall of the gate pattern and on the active region neighboring the gate pattern, and the outer spacer having a curved sidewall is formed on the inner spacer.

The isolation layer may include a dent in the region neighboring the active region. The blocking insulation layer is formed on the dent, such that a subsequently formed silicide layer is not formed on the dent.

Some embodiments of the invention provide a method for fabricating semiconductor devices that prevents formation of a silicide layer in selected regions by forming a blocking insulation layer on an active region neighboring an isolation layer. The method includes forming an isolation layer in a semiconductor substrate to define an active region. The method includes forming a gate pattern on the active region, and implanting impurities into the active region at both sides of the gate pattern. A spacer insulation layer is formed on a surface of the semiconductor substrate with the gate pattern. The spacer insulation layer has a region that becomes progressively thinner from the isolation layer to the gate pattern.

In any of the embodiments, the spacer insulation layer is deposited in an ambient of a chamber having a long mean free path, thereby the spacer insulation layer is relatively thin around the bottom edges of the gate pattern.

The spacer insulation layer is anisotropically etched to form sidewall spacers on sidewalls of the gate pattern, and to leave a blocking insulation layer on the isolation layer and on a portion of the active region neighboring the isolation layer. A silicidation process is applied to the semiconductor substrate to form a silicide layer on the source/drain regions between the blocking insulation layer and the sidewall spacers. Since the silicide layer is not formed on the blocking insulation layer, the silicide layer has a boundary aligned to the edges of the blocking insulation layer and the sidewall spacer.

In any of the embodiments, the spacer insulation layer is etched by high plasma power, as raising up an etch rate of the region neighboring the gate pattern, such that the sidewall spacers are formed and the blocking insulation layer is on the active region neighboring the isolation layer.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

We claim:

1. A semiconductor device comprising:
   an isolation layer disposed in a semiconductor substrate, the isolation layer defining an active region;
   a gate pattern disposed on the active region;
   source/drain regions disposed in the active region at both sides of the gate pattern;
   sidewall spacers disposed on sidewalls of the gate pattern, the sidewall spacers comprising an inner spacer having an L-shaped cross-section that is formed on a sidewall of the gate pattern and neighboring the gate pattern, and an outer spacer having a curved sidewall that is formed on the inner spacer and covering entire sidewalls of the gate pattern;
   a blocking insulation layer disposed on the isolation layer and on a portion of the active region neighboring the isolation layer, the blocking insulation layer spaced apart from the sidewall spacers; and
   a first silicide layer disposed on the source/drain regions between the blocking insulation layer and the sidewall spacers and having a boundary aligned to edges of the blocking insulation layer and the sidewall spacer.

2. The semiconductor device of claim 1, wherein the isolation layer includes a dent at the region neighboring the active region, and
   wherein the blocking insulation layer is formed on the dent.

3. The semiconductor device of claim 1, further comprising a second silicide layer disposed on a top surface of the gate pattern.

4. The semiconductor device of claim 1, wherein a slope of a surface of the blocking insulation layer immediately above the edge of the blocking insulation layer is less than a slope of a surface of the one of the sidewall spacers immediately above the edge of the one of the sidewall spacers.

5. The semiconductor device of claim 1, further comprising silicon nitride material disposed between the blocking insulation layer and the isolation layer.

6. The semiconductor device of claim 1, wherein a thickness of a portion of the blocking insulation layer disposed on the isolation layer is greater than a thickness of a portion of the blocking insulation layer at the edge of the blocking insulation layer.

7. A semiconductor device comprising:
   an isolation layer disposed in a semiconductor substrate, the isolation layer defining an active region, the isolation layer including an indentation in a region neighboring the active region;
   a gate pattern disposed on the active region;
   source/drain regions disposed in the active region at both sides of the gate pattern;
   sidewall spacers disposed on sidewalls of the gate pattern;
   a blocking insulation layer disposed on the isolation layer, the indentation, and on a portion of the active region neighboring the indentation; and
   a first silicide layer disposed on one of the source/drain regions between the blocking insulation layer and one of the sidewall spacers and having a boundary aligned to an edge of the blocking insulation layer and an edge of one of the sidewall spacers.

8. The semiconductor device of claim 7, wherein the sidewall spacer comprises:
   an inner spacer having an U-shaped cross-section that is formed on the sidewall of the gate pattern and on the active region neighboring the gate pattern; and
   an outer spacer having a curved sidewall that is formed on the inner spacer.

9. The semiconductor device of claim 7, further comprising a second silicide layer disposed on a top surface of the gate pattern.

10. The semiconductor device of claim 7, wherein a thickness of a portion of the blocking insulation layer disposed on the isolation layer is greater than a thickness of a portion of the blocking insulation layer at the edge of the blocking insulation layer.

11. The semiconductor device of claim 7, wherein a slope of a surface of the blocking insulation layer immediately above the edge of the blocking insulation layer is less than a slope of a surface of the one of the sidewall spacers immediately above the edge of the one of the sidewall spacers.

12. The semiconductor device of claim 7, further comprising silicon nitride material disposed on the isolation layer, the indentation, and on the portion of the active region neighboring the indentation, wherein the silicon nitride material is below the blocking insulation layer.

13. The semiconductor device of claim 7, wherein the blocking insulation layer fills the indentation.

* * * * *